United States Patent [19]

Bass

[11] 4,291,386
[45] Sep. 22, 1981

[54] PSEUDORANDOM NUMBER GENERATOR

[75] Inventor: David S. Bass, Floral Park, N.Y.

[73] Assignee: Sperry Corporation, New York, N.Y.

[21] Appl. No.: 118,180

[22] Filed: Feb. 4, 1980

Related U.S. Application Data

[62] Division of Ser. No. 965,122, Nov. 30, 1978, Pat. No. 4,222,514.

[51] Int. Cl.³ .............................................. H03B 29/00
[52] U.S. Cl. ...................................... 364/717; 331/78
[58] Field of Search ............................ 364/717; 331/78

[56] References Cited

U.S. PATENT DOCUMENTS 3,920,894 11/1975 Shirley et al. ...................... 364/717
3,986,168 10/1976 Anderson ............................ 364/717
4,202,051 5/1980 Davida et al. ...................... 364/717

Primary Examiner—Charles E. Atkinson
Attorney, Agent, or Firm—Howard P. Terry; Seymour Levine

[57] ABSTRACT

An apparatus for testing digital logic circuits without a computer and associated software employs a psuedorandom stream of input data to produce an unstructured output data stream which is analyzed by an efficient data collector and analyzer. Test signal generation is implemented by a pseudorandom number generator and a pseudorandom clock/reset generator while the resulting test data at the output terminals of the device under test is analyzed by a cycle redundancy code checker. Fault localization is realized, with selectable localization and manual probe modes and circuitry is provided for an efficient self-test mode.

1 Claim, 7 Drawing Figures

PSEUDORANDOM NUMBER GENERATOR

This is a divisional of application Ser. No. 965,122, filed Nov. 30, 1978, now U.S. Pat. No. 4,222,514 issued Sept. 16, 1980.

BACKGROUND OF THE INVENTION

1. Field of the Invention

The invention relates to testing digital modules and more particularly to a test set therefor that does not require a programmed computer.

2. Description of the Prior Art

Logic circuits consist of discrete semiconductor devices and integrated circuits of small scale, medium scale and large scale integration. A single logic board incorporates a multiplicity of such circuits and as packaging densities increase, fewer test points are available resulting in an ever increasing complexity of data streams at available test points. As a result, logic board testing has been accomplished by applying a data stream at various test points and noting the response thereto at other test points on the board. Applied data streams are tailored to the board under test and are generated by an actively participating computer which also evaluates the resulting responses. Each board type to be tested requires a corresponding computer program which must be generated, debugged and verified; generally, an expensive time consuming procedure.

Passive devices for testing logic circuits with a minimum of software support exist in the prior art. These devices employ a cyclic redundancy check code produced by a pseudorandom number generator. Pseudorandom numbers have random statistical properties for finite sequence of codes after which the sequence repeats. Data at the output terminals of the circuit under test, responsive to an external or self-applied stimulus at the input or test terminals thereof, are overlayed with the random codes produced by the pseudorandom number generator, disturbing its internal sequence. At the conclusion of the test sequence, a code appears at the output terminals of the tester which is unique to the circuit under test. Since these devices require either external or self-stimulus for the circuit under test, they do not eliminate the programmed computer and they are limited with respect to the logic circuits that may be tested.

Appreciable simplification to logic board testing, over that achievable by the prior art, may be realized with the application of pseudorandom numbers as the input data. Applying a pseudorandom sequence of sufficient length to the input terminals of the board under test, and applying clock and reset pulses on a pseudorandom basis, causes all logic circuits therewithin to be thoroughly exercised and the effect of all internal faults will propagate to the output terminals of the board. Thus, by noting the data at the output terminals of the board under test at the conclusion of each sequence and comparing it with data similarly obtained on a known good board, it is possible to determine whether faults exist within the board. It is to such a system that the present invention applies.

SUMMARY OF THE INVENTION

A digital tester constructed according to the principles of the present invention includes a multiplicity of circuit board receptacles, each wired to receive a sequence of psuedorandom codes from a pseudorandom number generator (PRNG) at the pins corresponding to the data input terminals of logic boards to be inserted therein for testing and to receive clock and reset pulses at corresponding clock and reset input terminals. The clock and reset generators are driven by the PRNG and provide random clock and reset signals to the board under test. A multiplexer coupled to the pins of each receptacle corresponding to the output terminals of the logic boards to be inserted therein, sequentially couples the data at these output terminals to a cyclic redundancy code (CRC) checker wherein the output data is analyzed and a fault determination is made. Self-testing of the digital tester may be provided by incorporating a self-test multiplexer which sequentially couples the data from the PRNG, the test clock generator, and the test reset generator to a data selector which is also coupled to the output terminal of the multiplexer, which during the self-test mode, is coupled through a switch directly to receive psuedorandom numbers from the PRNG. The data selector then sequentially couples the output data from the multiplexer and the self-test multiplexer to the CRC checker wherein this data is analyzed and a fault determination is made.

DESCRIPTION OF THE PREFERRED EMBODIMENT

Figure 1:
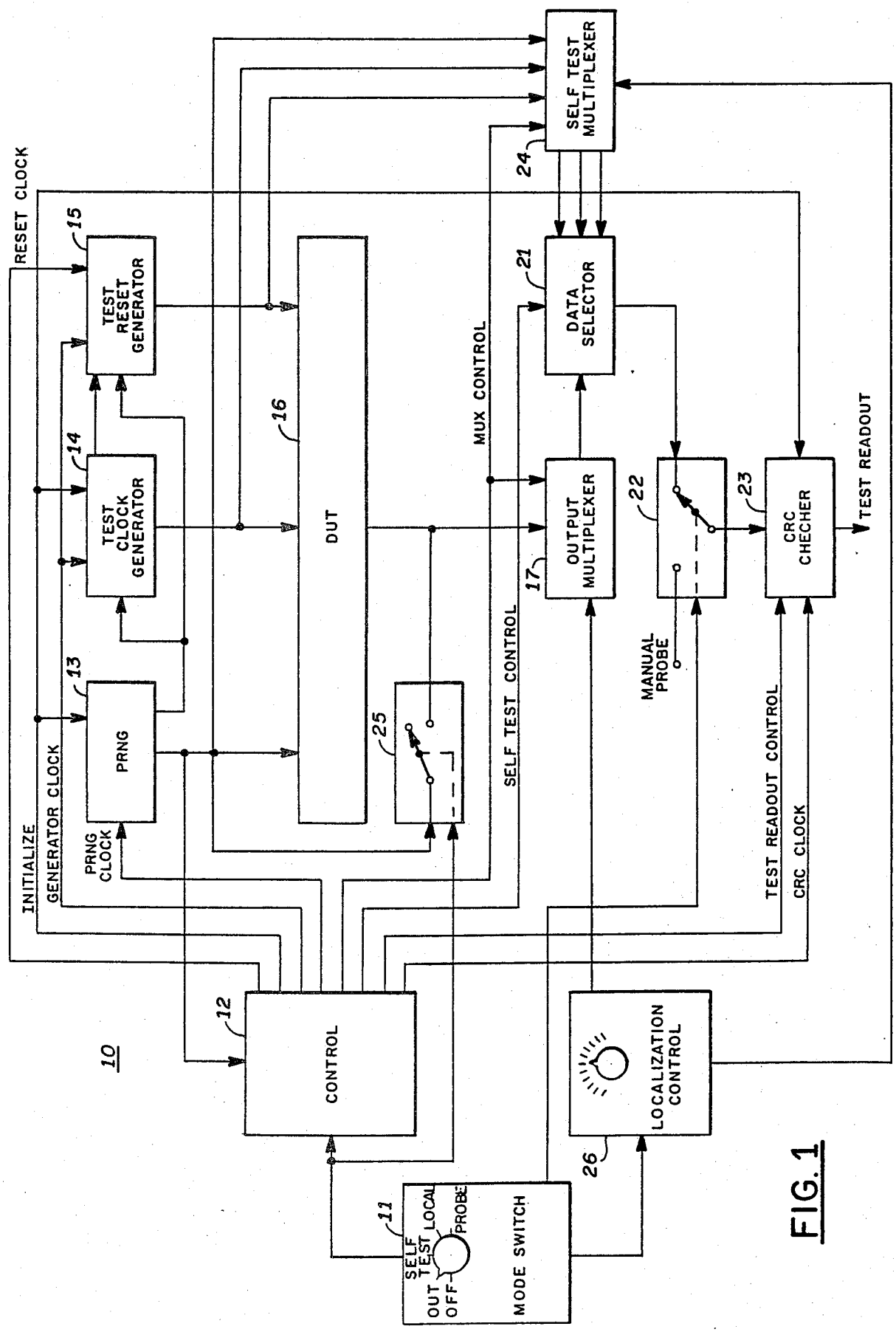
FIG. 1 is a block diagram of an embodiment of the invention.

Referring to FIG. 1, a digital tester 10 in accordance with the present invention may include a mode switch 11 for selecting the desired mode of operation, a control unit 12 which provides control signals for the operation of the digital tester in accordance with the mode selected at mode switch 11, and a pseudorandom number generator (PRNG) 13. A test clock generator 14 and a test reset generator 15 receive clock and initialization pulses from the control unit 12 and couple random numbers, clock pulses, and reset pulses to the data input terminals, clock terminals, and reset terminals, respectively, of the device under test (DUT) 16. The output terminals of the DUT 16 are coupled to an output multiplexer 17 which is controlled by multiplexer control signals from control unit 12 to sequentially couple these terminals through a data selector 21 and switch 22 to the input terminal of a cyclic redundancy code (CRC) checker 23, which receives clock pulses and test readout signals from the control unit 12. Upon reception of each test readout signal, the CRC checker 23 couples data to a readout device, not shown. The device under test is determined to be without fault if the readout corresponds to that previously obtained from a multiplicity of identical devices that were known to be faultless.

A self-test capability may be incorporated in the digital tester 10 by including a self-test multiplexer 24, a self-test position on mode switch 11, and a DUT bypass switch 25. The input terminals of the self-test multiplexer 24 are coupled to the output terminals of the PRNG 13, test clock generator 14, and test reset generator 15, while the output terminals, which may be one or more, are coupled to input terminals of the data selector 21. With the mode switch 11 in the self-test position, control unit 12 couples an energizing signal to the DUT bypass switch 25 causing the output terminals of the PRNG 13 to be directly coupled to input terminals of output multiplexer 17 and supplies a self-test signal to the data selector 21, which enables data selector 21 to function as a multiplexer.

The digital tester 10 may also include the capability to check the data at selected input terminals of the output multiplexer 17 (localization mode) and to provide manual probe testing of internal test points of the DUT 16 (probe mode). In the localization mode, mode switch 11 couples an enabling signal to localization control unit 26, which in turn couples a control signal to the output multiplexer 17. The DUT bypass 25 is not energized and all units other than the output multiplexer 17 operate as in the DUT mode of operation. Localization control unit 26 couples localization control signals to output multiplexer 17 which selects an input terminal thereof to couple to the output terminal while preventing all other input terminals from coupling data to the output terminal. The data from each selected input terminal is coupled through the data selector 21 and switch 22 to the CRC checker 23, wherein a test code is generated which is coupled to a readout device (not shown). The test code generated by the readout is compared with a pre-established test code for the output terminal under test. With the mode switch 11 in the manual probe position, a signal is coupled from the mode switch 11 to energize switch 22 which decouples the data selector 21 from the CRC checker 23 and couples a manual probe thereto. All of the units operate as in the DUT mode of operation. Each test point of the DUT and the digital tester itself may be probed and the data therefrom coupled to the CRC checker 23 with the resulting readout compared to a previously determined code thereby localizing faults in the DUT and/or the digital test unit.

Figure 2:
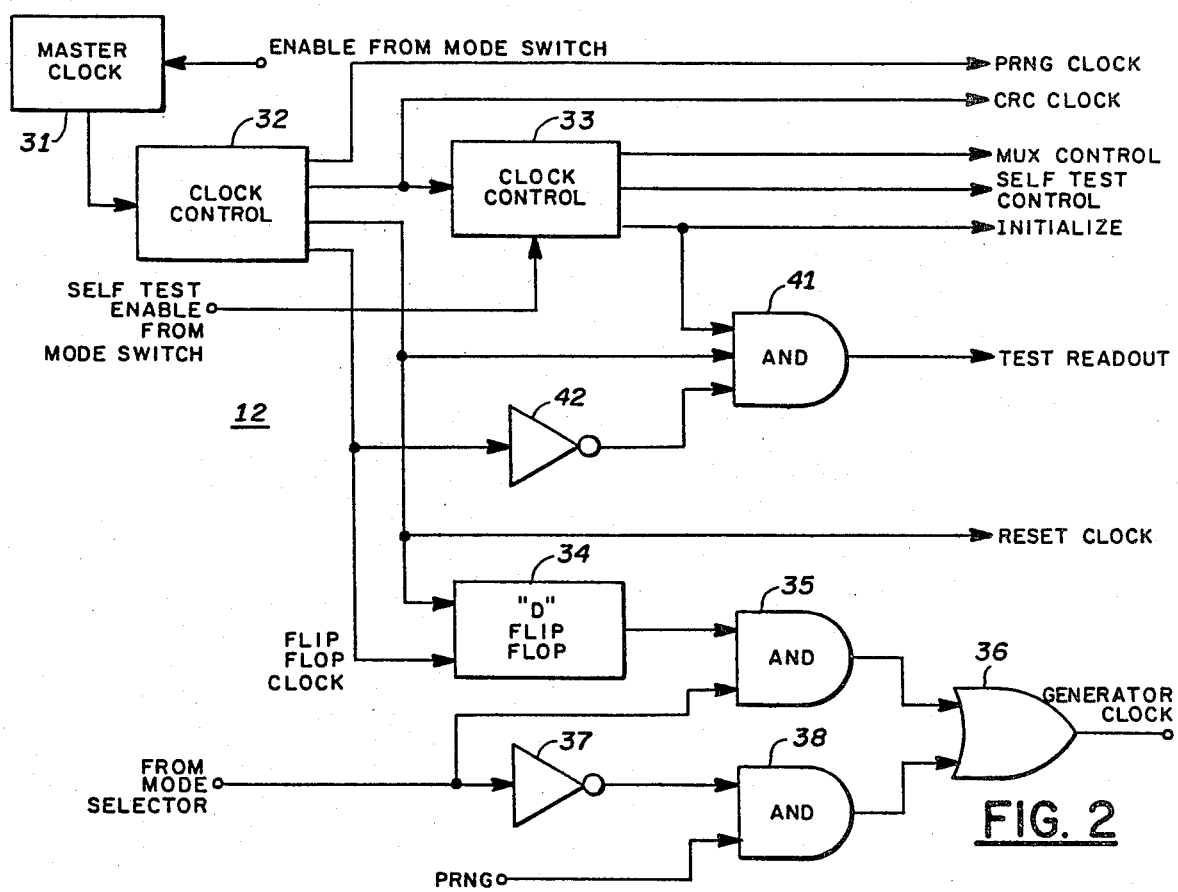
FIG. 2 is a block diagram of the control unit shown in FIG. 1.
Figure 3:
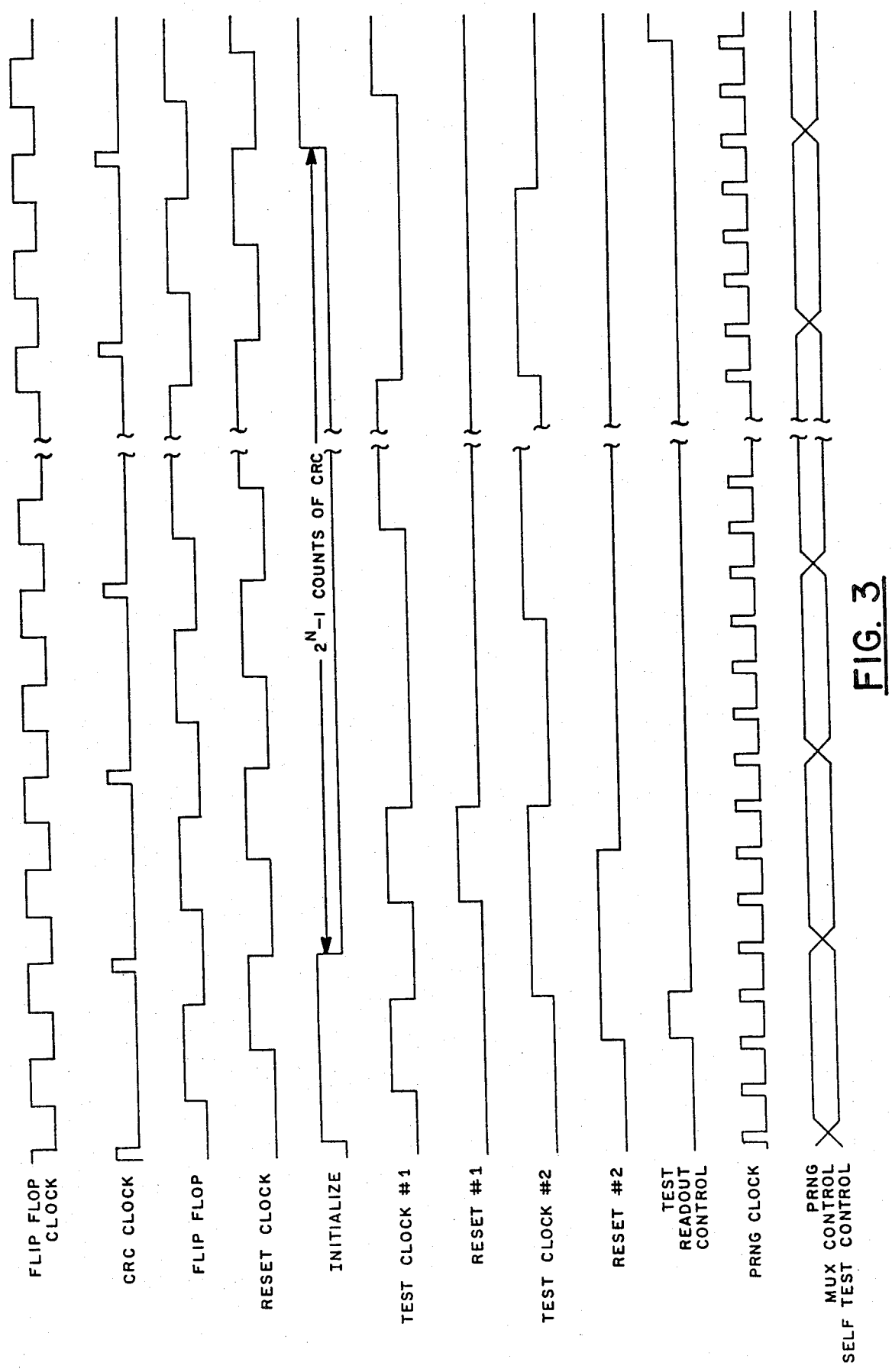
FIG. 3 is a representation of waveforms useful in explaining the invention.

The control unit 12 provides a clock and initialization signals to start the PRNG and CRC checker simultaneously from known initial states, controls all multiplexers, determines the number of test states between initialization pulses, commands the CRC to couple the test results to a display readout, and restarts the sequence after the test results have been displayed. A diagram of the control unit 12 is shown in FIG. 2. A master clock 31 is coupled to clock control 32 wherein the PRNG clock, CRC clock, reset clock, and flip-flop clock signals which are shown in the waveform diagrams of FIG. 3 are derived from the master clock in a conventional manner. In clock control 32, each reset clock pulse may be triggered by the trailing edge of each flip-flop clock pulse, as shown in FIG. 3. For a conventional PRNG, the waveform shown for the CRC clock may also serve as the PRNG clock. In a novel configuration, however, to be discussed subsequently, the PRNG clock must be of a higher frequency than the CRC clock. A waveform representative of this situation is shown in FIG. 3. The CRC clock pulses from clock control 32 are coupled to clock control 33 wherein the multiplexer control pulses and the initialization pulses, shown in FIG. 3, are generated in a conventional manner. The multiplexer steps from one input terminal to the next with each data change pulse, i.e., with each CRC pulse, thereby sequentially coupling each input terminal to the output terminal. Upon the reception of a self-test enabling signal from mode switch 11 of FIG. 1, clock control 33 provides a self-test control signal to data selector 21 thereby causing it to function as a multiplexer, multiplexing the output terminals of self-test multiplexer 24, and output multiplexer 17 to provide a data stream to CRC checker 23 through switch 22. Clock control 32 also provides reset clock pulses which are coupled to clock test reset generator 15 of FIG. 1 and are also coupled to the data input terminal of "D" flip-flop 34 which is clocked by the flip-flop clock pulses coupled from control 32. Flip-flop 34 may be toggled by the leading edge of each flip-flop clock pulse from control 32 to provide data at the output terminal thereof that is the data which appeared at the data input terminal during the previous clock pulse. The data at the output terminal of flip-flop 34, which is shown as the flip-flop waveform in FIG. 3, is coupled to one input terminal of AND gate 35, the other input terminal of which is coupled to mode selector 11 of FIG. 1. With mode selector 11 in the DUT position, a high level signal is coupled to the second input terminal of AND gate 35 thus enabling the flip-flop waveform to be coupled to an input terminal of OR gate 36. In this situation, the flip-flop waveform is coupled from the output terminal of OR gate 36 to the clock terminals of test clock generator 14 and test reset generator 15 of FIG. 1 to provide the clock pulses thereto.

With the mode selector switch 11 in the DUT position, the CRC 23 receives data during the data state changes and as a consequence thereof does not receive clocks and resets which are never active at these times. In the self-test mode, it is necessary for the CRC 23 to see all clock and reset pulses. This may be accomplished by providing a low level signal from the mode selector, when the mode selector switch is in the self-test position, to the second input terminal of AND gate 35 and to the input terminal of an inverter 37, the output terminal of which is coupled to a first input terminal of AND gate 38, the second input terminal of which is coupled to one output terminal of the PRNG 13, yet to be described, while the output terminal of AND gate 38 is coupled to an input terminal of OR gate 36. Thus, with the mode selector switch in the DUT position, a high level signal is coupled to AND gate 35 and a low level signal is coupled to AND gate 38 thus disabling AND gate 38, enabling AND gate 35 and permitting the waveform at the output terminal of flip-flop 34 to couple through AND gate 35 and OR gate 36 to couple to the clock terminals of test clock generator 14 and test reset generator 15. With the mode selector switch in the self-test mode, a low level signal is coupled to the second input terminal of AND gate 35 and to the input terminal of inverter 37, thus coupling a high level signal to the first input terminal of AND gate 38, disabling AND gate 35 and preventing the waveform at the output terminal of flip-flop 34 from coupling to OR gate 36. The high level signal coupled to the first input terminal of AND gate 38 enables AND gate 38 and permits the waveform at the output terminal of the PRNG 13, to which the second input terminal of AND gate 38 is coupled, to couple through AND gate 38 and OR gate 36 to the clock terminals of test clock generator 14 and test reset generator 15.

At the conclusion of each test sequence the CRC checker 23 in FIG. 1 receives a test readout signal from the control unit 12 causing the data at the output terminals thereof to be coupled to a readout device (not shown). Referring again to FIG. 2, this test readout pulse may be generated by coupling a first input terminal of AND gate 41 to the initialize signal output terminal of clock 33, coupling a second input terminal of AND gate 41 to the reset clock signal output terminal of clock control 32, and coupling a third input terminal of AND gate 41 via inverter 42 to the flip-flop clock output terminal of clock control 32. AND gate 42 will then provide a test readout signal when the reset clock waveform and the initialized waveform are at a high level and the flip-flop clock waveform is at a low level. Since these conditions can exist only once in every $2^n-1$ counts of the CRC clock, the signal at the output terminal of AND gate 41, which is that as shown in FIG. 3 as test readout control, provides a high level signal at the conclusion of each test sequence.

A psueudorandom number is a sequence of ONES and ZEROES which appears to be random over a given sequence length after which the sequence is repeated. Implementation of a pseudorandom generator (PRNG) may be accomplished with a linear feedback n bit shift register. PRNGs of this type may have any sequence length up to $2^n-1$ and devices of this sort having maximal length, which repeat the sequence after exactly $2^n-1$ bits are well known in the art. In these generators, there is an exact one clock interpulse interval between pseudorandom numbers available at the output terminals, causing each succeeding number to be of the same pseudorandom numbered sequence delayed by one bit. Though these PRNGs may be utilized as the data source for the DUT 16 in this invention, the one bit delay does not provide an optimum data pattern. This pattern may be improved by coupling each stage of the n bit shift register through a corresponding stage of an n bit register which is loaded at a slower rate than that of the PRNG clock, thus providing $2^n-1$ numbers which are randomly selected from the pseudorandom number sequence.

Figure 4:
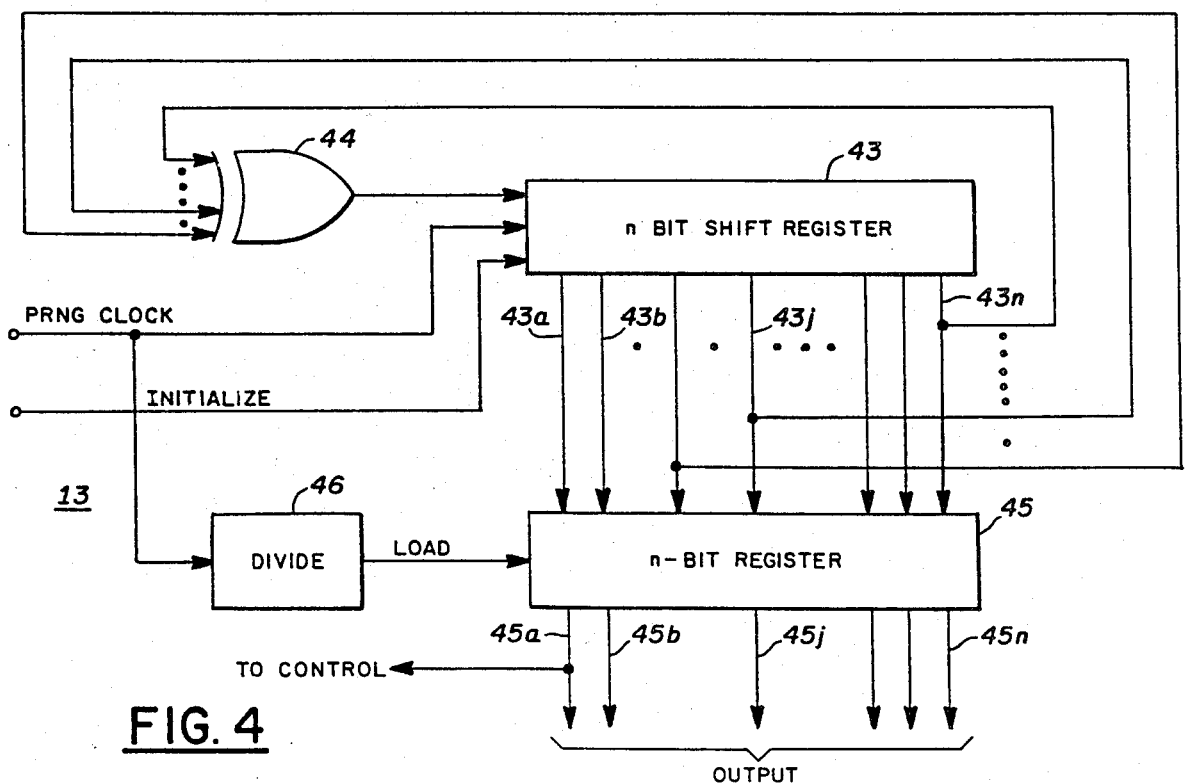
FIG. 4 is a block diagram of the PRNG shown in FIG. 1.

Refer now to FIG. 4. An n bit shift register 43 is provided with output taps at each stage 43a through 43n. A plurality of taps, which may number K, are coupled to a K bit modulo two adder 44 which provides a one at the output terminal thereof when an odd number of the K input terminals have a one coupled thereto. The K number of taps coupled to the K input terminals of the modulo two adder 44 are chosen to provide a maximum length pseudorandom sequence. Each stage of the n bit shift register 43 is coupled through the taps 43a through 43n to corresponding stages in an n bit register 45 which is loaded at a slower rate than the shifting rate of the n bit shift register 43. This may be accomplished by coupling the PRNG clock to the n bit register through a divide circuit 46. After initialization, at least one stage of the n bit shift register 43 contains a one and with each succeeding PRNG clock pulse to shift register 43, the signal at the output terminal of the K bit modulo two adder 44 is coupled into the first stage of the n bit shift register 43. With each succeeding clock pulse, this signal changes pseudo randomly as a result of the feedback from the K taps of the n bit shift register 43. With each PRNG clock pulse, the code available to the n bit register 45 is altered. This continues until $2^n-1$ codes are made available after which the sequence repeats. If, for example, divide circuit 44 provides a divide-by-four function, every fourth code available to the n bit register 45 is loaded therein and made available at the output terminals thereof. Since $2^n-1$ is an odd number dividing by an even number such as four, will cause all of the $2^n-1$ codes to be available in a sequential manner before repeating the sequence. The output terminals 45a through 45n of the n bit register 45 are coupled to the data terminals of the DUT 16, while one terminal, as for example terminal 45a, is also coupled to the second input terminal of AND gate 38. Since data is coupled to the DUT 16 at the CRC clock rate, it is necessary for the PRNG clock rate to exceed the data rate by a multiple that is equal to that of the divide circuit 46, which in the example just given is 4. This is illustrated in FIG. 3 wherein the PRNG clock repetition rate is four times the CRC clock repetition rate.

Figure 5:
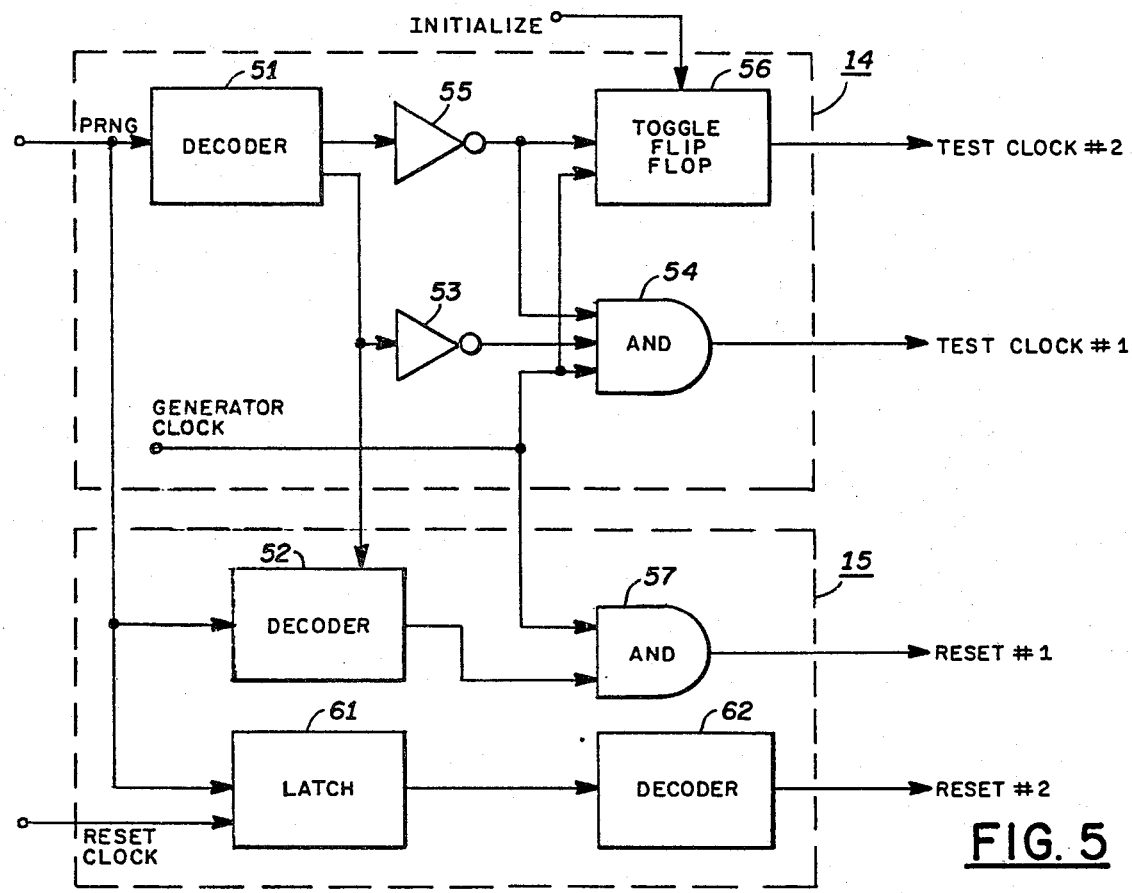
FIG. 5 is a block diagram of the test clock generator and test reset generator shown in FIG. 1.

A timing generator for a digital test module must satisfy the functional timing requirements of the modules to be tested and be capable of exercising almost all conditions required for a complete module test. To accomplish this, it is necessary to provide timing signals with proper exclusivity and with sufficient frequency of occurrence for the devices to be tested. Some digital devices require data changes, clock and reset signals which overlap while others require exclusivity of these events. Modules requiring complete exclusivity may utilize the signal set labelled test clock one and reset one in FIG. 3 while modules which do not require exclusivity may utilize the signal set labelled test clock 2 and reset 2. The generation of these signal sets will be explained with reference to FIG. 5. The test clock generator 14 may include a decoder 51, which decodes a K bit input to $2^k$ output terminals, having k input terminals coupled correspondingly to k of the n output terminals of the PRNG 13. One output terminal is coupled to test reset generator 15, the purpose of which will be explained subsequently and via inverter 53 to an input terminal of a plurality of AND gates 54. Each of the remaining $2^k-1$ output terminals are coupled through inverters 55 to the clock terminal of a corresponding one of k toggle flip-flops 56 and to a second input terminal of a corresponding one of k AND gates 54. The clock terminal of each of the toggle flip-flops 56 and a third input terminal of AND gates 54 are coupled to the output terminal of OR gate 36 to receive generator clock pulses. With this circuitry, there will be a high level signal for the test clock number 1 waveform at the output terminals of each of the AND gates 54 for $2^k-1$ states out of every $2^k$ states. Each of the flip-flops 56, the output signals of which comprise the test clock number 2 waveform, are enabled for $2^k-1$ states and may be toggled on the falling edge of the generator clock pulses received from the control unit. This combination causes a high level signal at the output terminal of each of the toggle flip-flops 56 to occur on $2^k-1$ out of $2^{(k+1)}$ states.

Referring again to FIG. 5, test reset generator 15 may include a decoder 52, which decodes a l bit input to $2^l$ output terminals, having l input terminals coupled correspondingly to l of the n output terminals of the PRNG 13. The $2^l$ output terminals may each be coupled to an input terminal of a corresponding one of l AND gates 57. A second input terminal of each of the l AND gates 57 being coupled to the output terminal of OR gate 36 of FIG. 2 to receive generator clock pulses. Still referring to FIG. 5, m of the n output terminals of the PRNG 13 may each also be coupled correspondingly to one of m latch circuits 61, each of which is clocked by the reset clock of control unit 12. Each output terminal of the m latch circuits 61 is coupled to an input terminal of a decoder 62 which decodes this m bit input to $2^m$ output terminals.

A pulse representative of a high level signal, or a one, will occur at each output terminal of decoder 52 on one cycle out of each $2^l$ cycles for which it is enabled. It is enabled from decoder 51, however, on only one cycle out of each $2^k$ cycles. Consequently, only one pulse, such as that shown as reset number 1, will appear at the output terminal of each of the AND gates 57 for each $2^{(k+l)}$ states. Each latch 61 is toggled on the leading edge of the reset clock pulse, thus providing a high level signal, such as that shown as reset number 2 in FIG. 3, to at least one input terminal of the decoder 62 and concomitantly to one of the output terminals thereof. Thus, each output terminal of the decoder 62 will have coupled thereto one reset number 2 pulse out of each $2^m$ data states.

Figure 6:
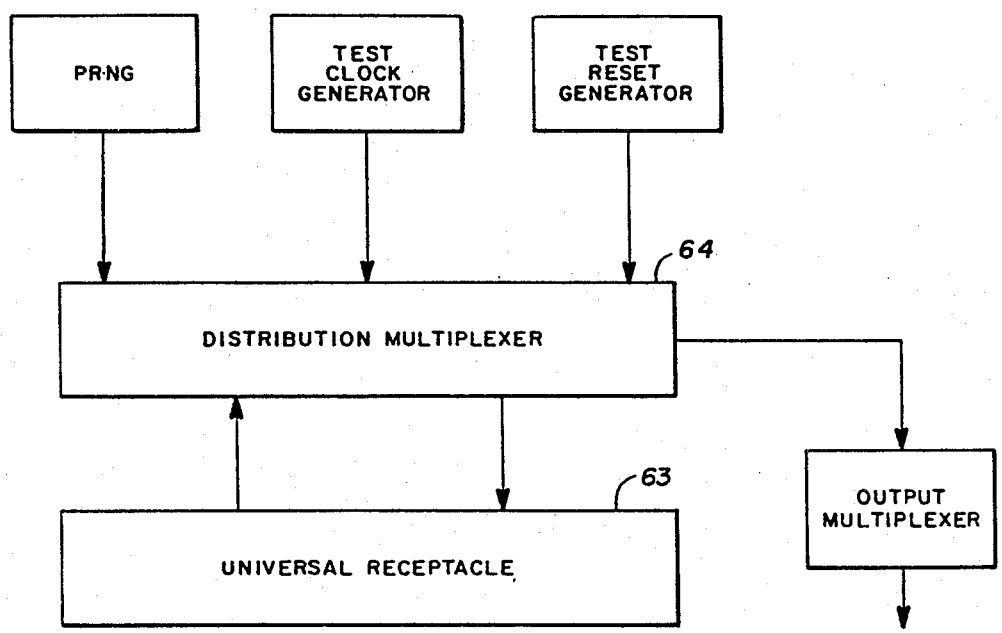
FIG. 6 is a block diagram of an embodiment of the invention wherein a universal receptacle for insertion of the circuit board to be tested is employed.

The distribution of the PRNG data signals to the DUT 16 input terminals and the coupling of the output terminals thereof to the output multiplexer 17 may be accomplished with a universal receptacle 63 and a distribution multiplexer 64 as shown in FIG. 6 and associated software to direct proper multiplexing for each module, or by providing a multiplicity of dedicated receptacles each hardwired to the PRNG 13 and the output multiplexer 17 in FIG. 1 to provide the proper input and output terminal couplings for a given module type. The use of dedicated receptacles avoids the addition of the distribution multiplexer 64 and eliminates the software required for the proper addressing of the receptacle terminals for each module under test. The distribution multiplexer 64 may be eliminated when a universal receptacle is employed by designing the output multiplexer 17 of FIG. 1 to sample all the terminals of the universal receptacle. This would couple the input data as well as the output data of the DUT to the CRC checker 23, but not affect the uniqueness of the test readout code at the output terminals thereof. Initialization signals are not required to either the dedicated receptacles or the universal receptacle. Initialization is accomplished automatically in the DUT by running the test in a repetitive fashion. Test cycles of sufficient length will eliminate all transient errors, for which DUT will achieve a well defined state after one complete test cycle.

A cycle redundancy code (CRC) checker receives a stream of digital data as a polynomial, divides the received polynomial by a polynomial which is characteristic of the CRC checker and presents the remainder of the division as the CRC code. An n bit CRC checker has an nth order characteristic polynomial so that the polynomial division results in an n bit remainder code. A CRC checker compresses an m bit input data stream representing a m dimensional space into an n bit code representing an n dimensional space and may be regarded as a pseudorandom mapper of an m dimensional space into an n dimensional space. For m greater than n, this represents an efficient compression of data. When a CRC code for a particular input data stream is determined, it is well known in the art that the probability of an n bit CRC checker providing the same result for any other data stream is approximately $(\frac{1}{2})^n$. Thus, the probability of the CRC checker missing a failure is, for example, less than 0.002% if $N=16$. A unique CRC code may be determined for each module by testing a multiplicity of such modules that are presumed good and noting the test output code for each. A code for the module is established when the test output code of a predetermined number of modules is invariant.

Figure 7:
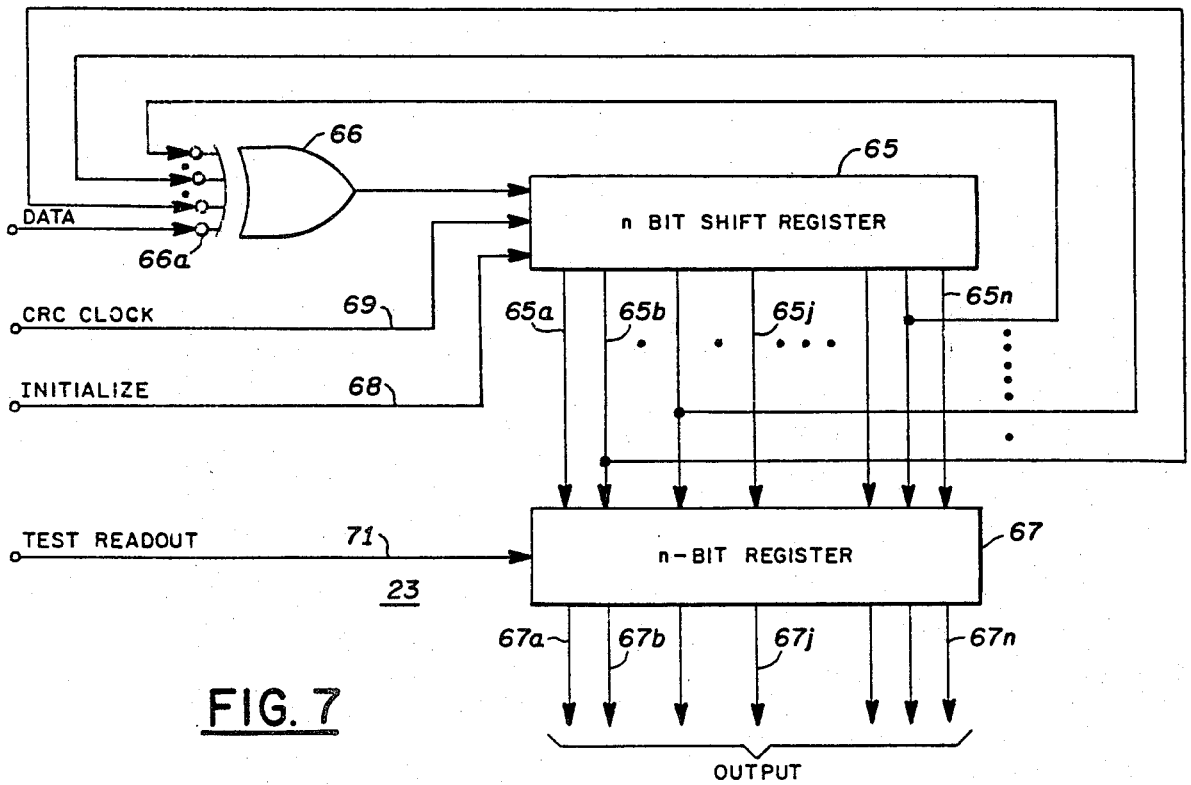
FIG. 7 is a block diagram of the CRC checker shown in FIG. 1.

Referring to FIG. 7, CRC checker 23 may comprise an n bit shift register 65 provided with output taps 65a through 65n at each stage. A plurality of taps which number L are coupled to an L bit modulo two adder 66 which provides a high level signal at the output terminal thereof when an odd number of the L input terminals have a high level signal coupled thereto. An input terminal 66a of the L bit modulo two adder 66 is coupled to switch 22 of FIG. 1 to receive the data to be analyzed. Each stage of the n bit shift register 65 is coupled through the taps 65a through 65n to corresponding stages in an n bit register 67. The n bit shift register is initialized with a high level signal in at least one stage by the initialization signal coupled from control unit 12 via lead 68 and is clocked by the CRC clock signal coupled from control unit 12 via lead 69. At the conclusion of the test cycle, the n bit register 67 receives a test readout signal via line 71 from the control 12 and couples the CRC code contained therein via leads 67a through 67n to a test readout device not shown. To detect periodic errors in a circuit board under test, the bit length of the CRC checker 23 should be at least equal to the number of bits of the test cycle counter. As for example, a CRC checker should have a 20 bit length when a 20 bit counter controls the generation of the initialization pulses. Additionally, to minimize the probability of circuit board error cancellation, the CRC checker 23 should possess a feedback configuration that differs from that of the PRNG 13.

While the invention has been described in its preferred embodiments, it is to be understood that the words which have been used are words of description rather than limitation and that changes may be made within the purview of the appended claims without departing from the true scope and spirit of the invention in its broader aspects.

I claim:

1. A pseudorandom number generator comprising:
    shift register means having tap means at each stage thereof, data input means and clock input means;
    K bit modulo two adder means coupled at input means thereof to K selected tap means of said shift register means and at output means thereof to said data input means of said shift register means;
    register means with each stage thereof coupled correspondingly to said tap means of said shift register means, said register means having tap means at each stage thereof and clock input means; and
    means coupled between said clock input means of said shift register means and said clock input means of said register means for providing a clock pulse to said clock input means after a preselected number of clock pulses have been applied to said clock input means of said shift register means whereby after each clock pulse applied to said register means a data code is available at said tap means of said register means.

* * * * *